(12) United States Patent
Pidin

(10) Patent No.: US 7,492,014 B2
(45) Date of Patent: Feb. 17, 2009

(54) SEMICONDUCTOR DEVICE

(75) Inventor: Sergey Pidin, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 313 days.

(21) Appl. No.: 11/150,121

(22) Filed: Jun. 13, 2005

(65) Prior Publication Data

US 2006/0214241 A1  Sep. 28, 2006

(30) Foreign Application Priority Data

Mar. 24, 2005  (JP) .............................. 2005-086002

(51) Int. Cl.
*H01L 27/092* (2006.01)
(52) U.S. Cl. ............... 257/369; 257/649; 257/E29.255; 438/275
(58) Field of Classification Search ................. 257/388, 257/369
See application file for complete search history.

(56) References Cited

U.S. PATENT DOCUMENTS 7,205,615 B2 * 4/2007 Tsutsui et al. ............... 257/369
7,223,647 B2 * 5/2007 Hsu et al. .................... 438/199
2004/0075148 A1 * 4/2004 Kumagai et al. ............. 257/369
2005/0145894 A1 * 7/2005 Chau et al. .................. 257/288
2006/0249794 A1 * 11/2006 Teh et al. ..................... 257/369

FOREIGN PATENT DOCUMENTS

JP   2000-31296   1/2000

* cited by examiner

*Primary Examiner*—Jerome Jackson, Jr.
*Assistant Examiner*—Paul A Budd
(74) *Attorney, Agent, or Firm*—Westerman, Hattori, Daniels & Adrian, LLP.

(57) ABSTRACT

A semiconductor device wherein the same metal gate material is used for both an n-channel CMOS transistor and a p-channel CMOS transistor and a manufacturing method therefor are disclosed. The n-channel transistor includes an impurity region, a first gate laminated body that has a gate oxide film and a gate electrode but does not have a gate electrode sidewall insulating film, and a first silicon nitride film that has a tensile stress and covers the surface of a semiconductor substrate and the first gate laminated body. The p-channel transistor includes an impurity region; a second gate laminated body that has a gate oxide film, a gate electrode, and a gate electrode sidewall insulating film; and a second silicon nitride film that has a compressive stress and covers the surface of the semiconductor substrate and the second gate laminated body.

7 Claims, 8 Drawing Sheets

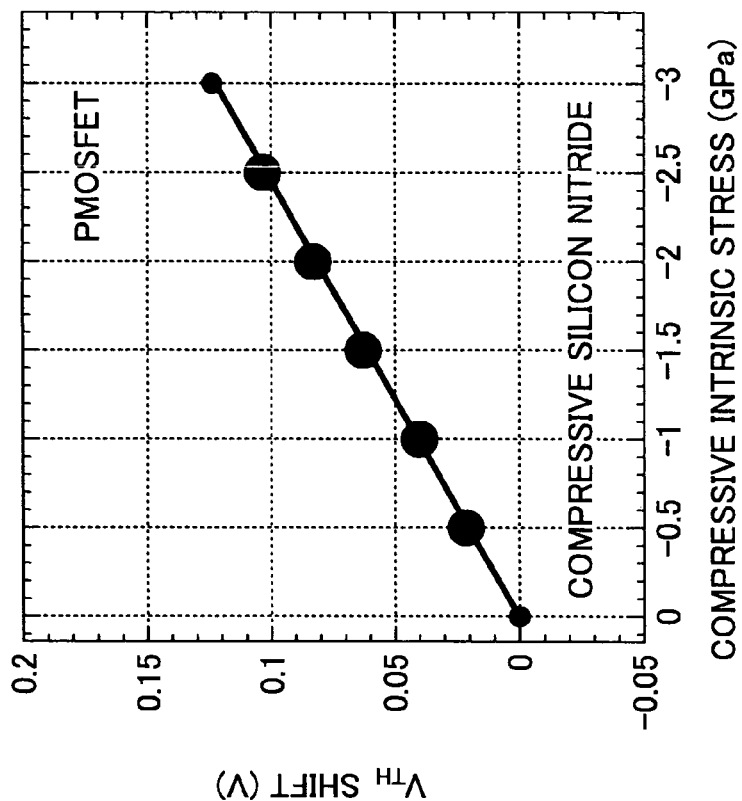
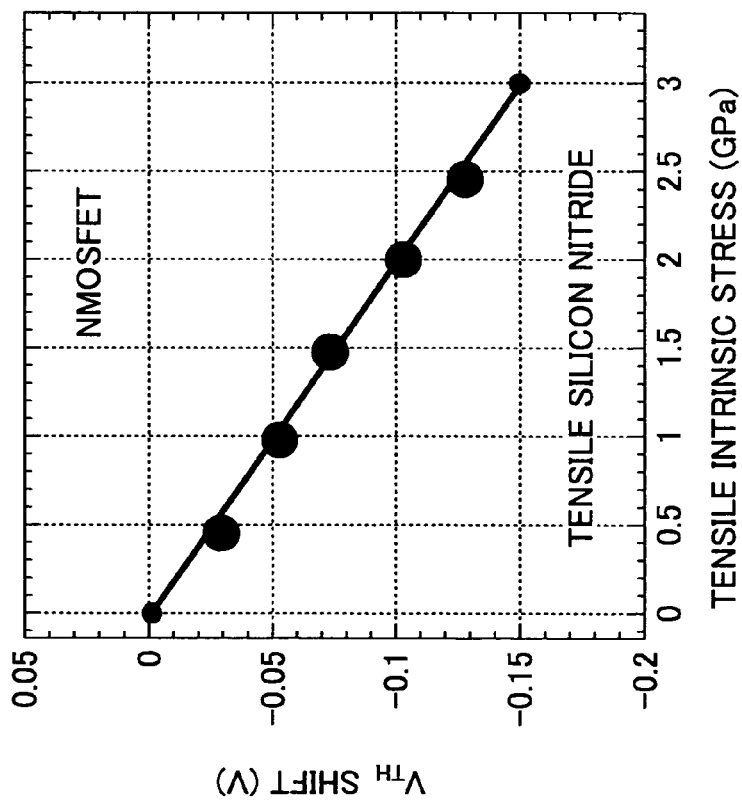
FIG.2B
FIG.2A

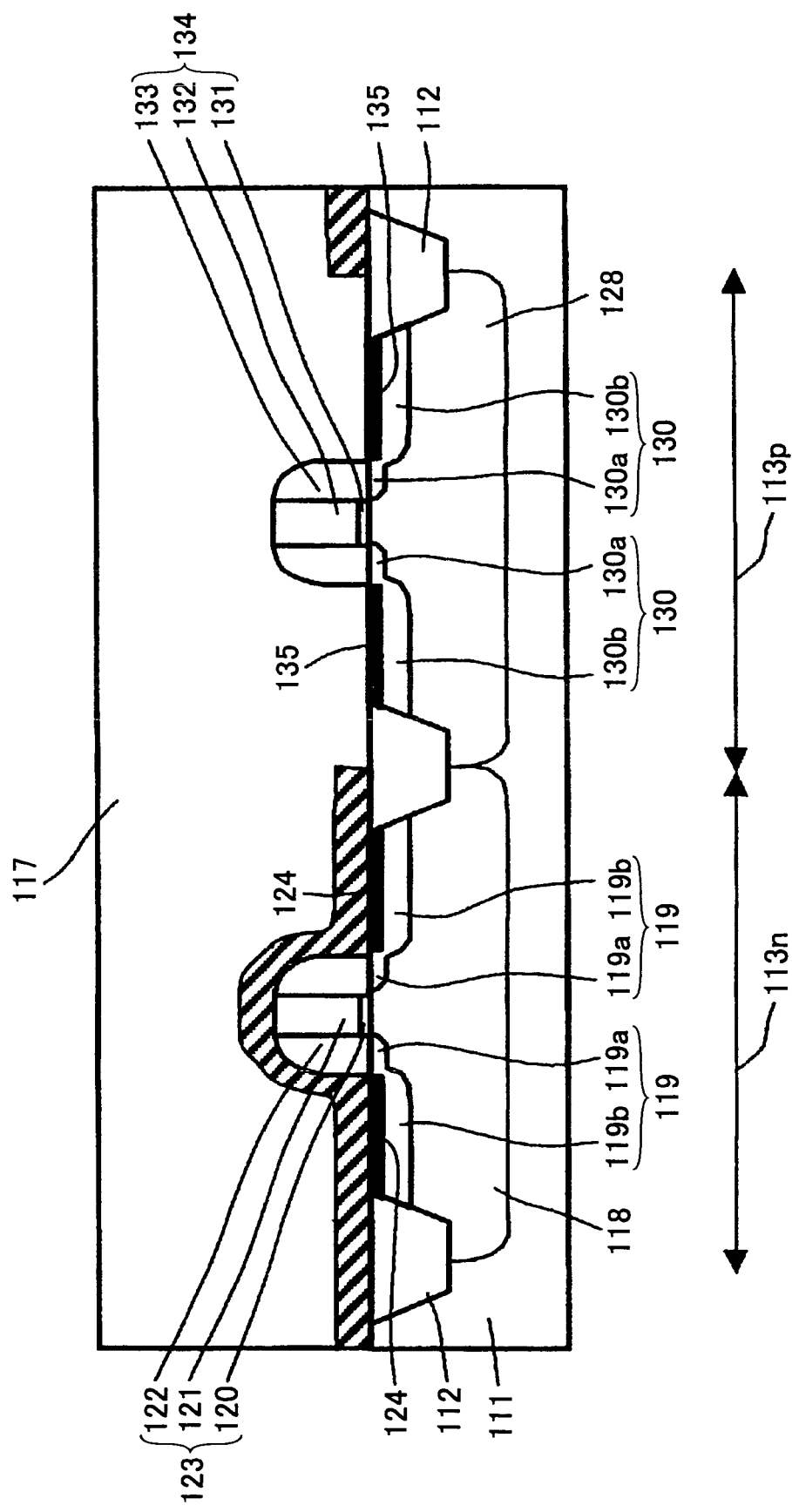

SEMICONDUCTOR DEVICE

CROSS-REFERENCE TO RELATED ART APPLICATIONS

This application is based upon and claims the benefit of priority from the prior Japanese Patent Application No. 2005-086002, filed on Mar. 24, 2005, the entire contents of which are incorporated herein by reference.

BACKGROUND OF THE INVENTION

1. Field of the Invention

The present invention relates to a semiconductor device and a manufacturing method therefor, and particularly relates to a CMOS semiconductor device and a manufacturing method therefor.

2. Description of the Related Art

The operating speed of CMOS transistors has been improving in order to increase the operating frequency of microprocessors. The speed improvement owes much to miniaturization of CMOS transistors. The miniaturization of CMOS transistors has been achieved by channel length reduction due to wavelength reduction of light used in lithography and by thickness reduction of gate oxide films of gate electrodes. However, minimum photo-etching size is becoming smaller than the wavelength of light used in lithography. Moreover, thickness reduction of gate oxide films of gate electrodes cannot go beyond current limits because withstand pressure of the films needs to be maintained. As a result, further miniaturization of CMOS transistors is becoming difficult.

In view of these facts, it has been proposed to use a metal material as a gate electrode material in CMOS transistors having a minimum photo-etching size is 50 nm or less (e.g. Japanese Patent Laid-Open Publication No. 2000-31296).

If a metal material is used as a gate electrode material, gate electrode depletion is suppressed and gate electrode resistance is reduced in comparison with conventionally-used polysilicon materials.

However, transistors having metal gate electrodes containing a stable metal material generally have a threshold voltage absolute value as high as 0.5 V (typical value). Therefore, it is difficult to apply such transistors to high-speed semiconductor devices. Furthermore, if a stable material that is applicable to both n-channel transistors and p-channel transistors is used as a gate electrode material, an allowable range of threshold voltage becomes smaller, thereby making it difficult to design versatile semiconductor devices.

SUMMARY OF THE INVENTION

A general object of the present invention is to provide a semiconductor device and a manufacturing method therefor to solve at least one problem described above. A specific object of the present invention is to provide a semiconductor device having a preferable transistor structure wherein a metal gate material is applied as a gate electrode material and a manufacturing method therefor.

To achieve these and other objects, the present invention provides a semiconductor device having an n-channel transistor and a p-channel transistor wherein gate electrodes of the n-channel transistor and the p-channel transistor are made of the same metal material, and stresses corresponding to channel regions are applied to the gate electrodes.

According to the present invention, a metal material used as a gate material of a CMOS transistor has a work function such that an absolute value of a threshold voltage becomes about 0.5 V. Accordingly, a tensile stress can be applied to an n-type channel region so as to lower the threshold voltage of the n-channel transistor. Also, a compressive stress can be applied to a p-type channel region so as to lower the threshold voltage (absolute value) of the p-channel transistor. As stresses in the regions are increased, changes of the threshold voltages corresponding to the regions are also increased. A semiconductor device that has achieved a desired threshold voltage in this way can select between n-channel and p-channel transistor characteristics, and therefore has high versatility. It is especially preferable that the present invention be applied to a transistor structure which requires a linewidth of 50 nm or less where tradeoff of miniaturization becomes apparent.

BRIEF DESCRIPTION OF THE DRAWINGS

FIGS. 2A and 2B are graphs of relationship between a threshold voltage of a MOSFET and a stress of a cover film;

FIG. 6 is a cross-sectional view illustrating a basic structure of CMOS transistors according to a second modification of the present invention.

DETAILED DESCRIPTION OF THE PREFERRED EMBODIMENT

Preferred embodiments of the present invention are described hereinafter in detail. The embodiments of the present invention may be modified according to intended characteristics of CMOS transistors.

First Embodiment

Figure 1:
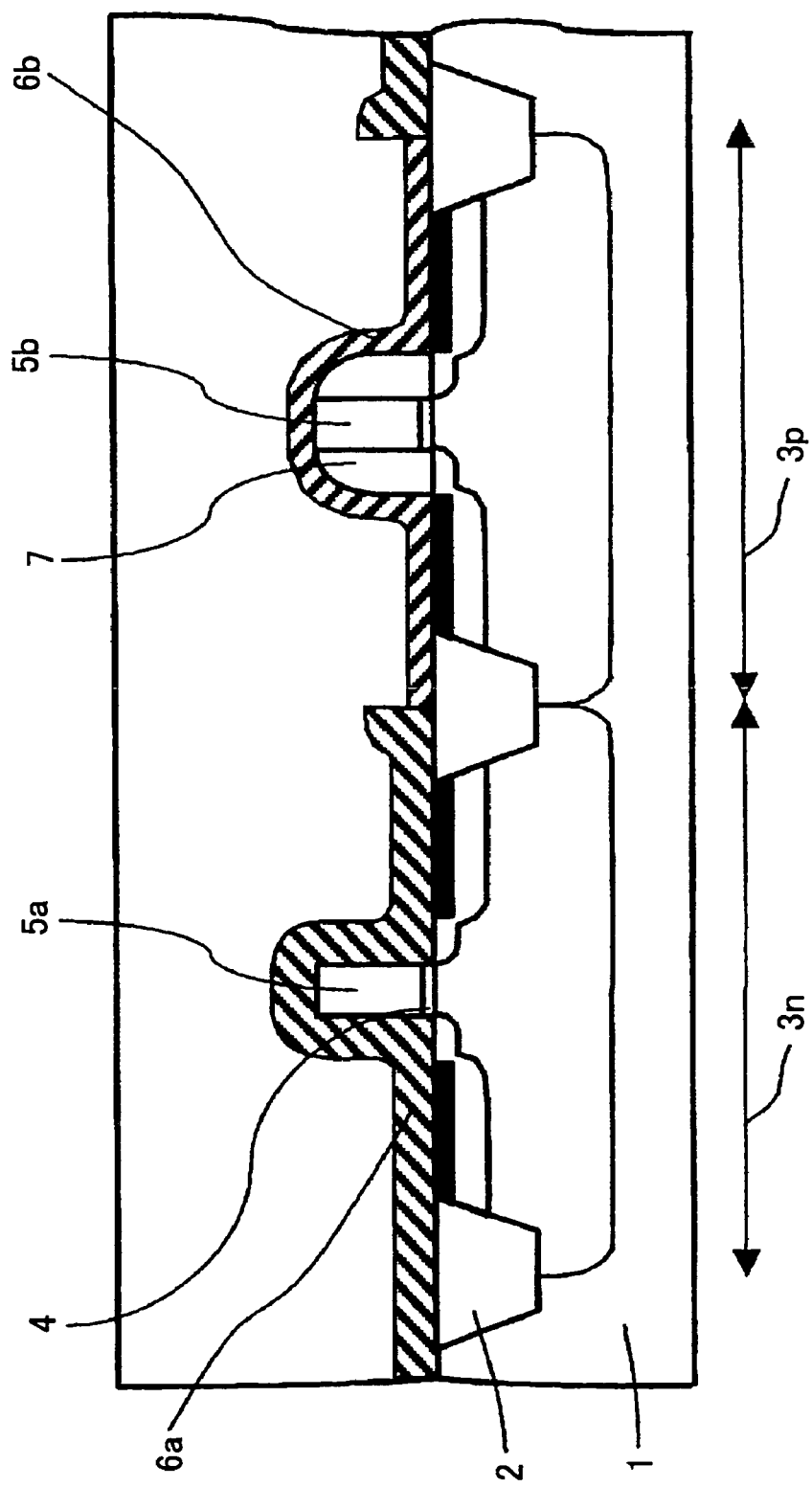
FIG. 1 is a cross-sectional view illustrating a basic structure of CMOS transistors according to a first embodiment of the present invention.

FIG. 1 shows a CMOS semiconductor device having an n-channel transistor and a p-channel transistor, wherein gate electrodes of the n-channel transistor and the p-channel transistor are made of the same metal material.

A semiconductor substrate 1 includes a first region 3n where the n-channel transistor is formed and a second region 3p where the p-channel transistor is formed. The first region 3n and the second region 3p are defined by element separation membranes 2, and are provided with gate electrodes 5a and 5b, respectively, made of a metal material with gate oxide films 4 placed therebetween.

The first region 3n is provided with a cover film 6a having a tensile stress and covering the gate electrode 5a. On the other hand, the first region 3p is provided with a cover film 6b having a compressive stress and covering the gate electrode 5b and sidewall spacers 7 disposed on sidewalls of the gate electrode 5b. Even though the gate electrodes 5a and 5b of the n-channel transistor and the p-channel transistor are made of the same metal material, the semiconductor device having this configuration can offer desired performance by controlling a threshold voltage.

FIG. 2A shows how the threshold voltage of the n-channel transistor having the structure of FIG. 1 changes in relation to the stress of the cover film 6a. It can be seen from FIG. 2A that as the stress of the cover film 6a increases from 0 to 3 GPa, the threshold voltage change ranges from 0 to −0.15 V.

FIG. 2B shows how the threshold voltage of the p-channel transistor having the structure of FIG. 1 changes in relation to the stress of the cover film 6b. It can be seen from FIG. 2B that as the stress of the cover film 6b decreases from 0 to −3 GPa, the threshold voltage change ranges from 0 to 0.125 V. That is, the threshold voltage of the gate electrodes made of a metal material can be controlled by causing strain in channel regions.

A method of causing strain in a channel region is not limited to stress control of a cover film, but may include stress control of a source and a drain arranged on opposing sides of a channel region, and stress control of element separation membranes in which oxide films having suitable characteristics and structure are embedded.

The cover film may include a nitride film, a silicon oxide film and a film containing SiC of which film density is controllable. If an etching stopper function and a moisture resistance improving function are added to the cover film, the semiconductor device can offers stable performance.

Second Embodiment

A manufacturing flow of the CMOS transistors of FIG. 1 is described with reference to FIGS. 3A-3F.

Figure 3A:
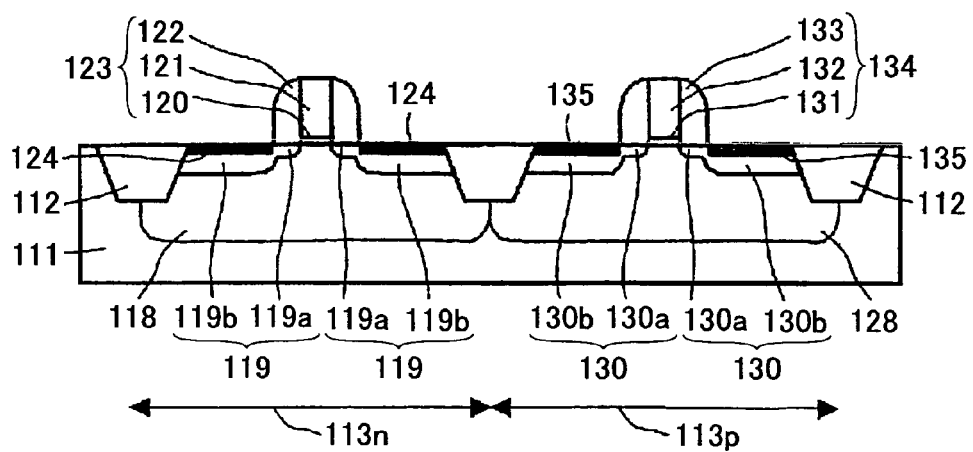
FIGS. 3A-3F are cross-sectional views illustrating a manufacturing flow of CMOS transistors according to a second embodiment of the preset invention.

First, referring to FIG. 3A, element separation regions 112 are formed in the semiconductor substrate 111 by an STI method. A p-type well region 118 is formed in the first region 113n, where the n-channel transistor is formed, by implanting p-type conductive impurities by an ion implantation method. An n-type well region 128 is formed in the second region 113p, where the p-channel transistor is formed, by implanting n-type conductive impurities by an ion implantation method.

Then, a silicon oxide film and a polysilicon film are formed on the surface of the semiconductor substrate 111. After that, gate oxide films 120 and 131 and temporary dummy gate electrodes (not shown) made of polysilicon films are formed by an etching method. The dummy electrodes are replaced by metal electrodes in the following process. A plasma TEOS film is formed on the semiconductor substrate 111 to cover the dummy electrodes by a CVD method. After that, polishing is performed by a CMP method until the surfaces of the dummy electrodes are exposed. The purpose of the polishing may not be flattening, and the polishing may be performed without using a polish stopper such as SiN.

Then, the dummy electrodes are selectively removed by a dry etching method. A reactant gas containing $Cl_2$ may be used as an etching gas so as to achieve high selectivity with a base gate oxide film.

Then, W films are selectively grown by a CVD method in grooves formed by etching the dummy electrodes. W is a preferable choice because it has a Mid-Gap work function as a gate electrode material to allow the use of a cover film exerting a stress that is practically sufficient to adjust the threshold voltage of the transistor. Polishing by a CMP method may be included for further flattening the surface of W after the selective growth. Even if a method of forming a film that does not apply selective area growth is used, excessive W can be removed by a CMP method so as to selectively expose the gate electrode surface. A practical gate electrode capable of reacting to appropriately selected and applied stress of the cover film can be obtained by setting the gate length to 30 through 40 nm and the gate height to around 100 nm.

Then, the plasma TEOS film around the gate electrode is selectively removed by a dry etching method. An etching gas may contain Freon 32 and $Br_2$ so as to achieve high selectivity with the base Si substrate 111.

In this way, the gate electrodes 121 and 132 made of W are formed. Then, shallow junction regions 119a and 130a are formed by implanting n-type conductive impurities into the first region 113n and p-type conductive impurities into the second region 113p by masking with the gate electrode 121 and 132, respectively. The junction regions 119a and 130a may be formed by an ion implantation method after the dummy electrodes are formed. The ion implantation energy may be determined in view of thermal history in the following processes.

Then, an insulating film made of a silicon oxide film is formed to cover the surface of the Si substrate 111 and the gate electrodes 121 and 132. The insulating film is etched back to form gate electrode sidewall insulating films 122 and 133. The width of the sidewall is around 50 nm. A first gate laminated body 123 and a second gate laminated body 134 are thus formed. If the junction regions 119a and 130a are formed by masking with dummy electrodes, the gate electrode sidewall insulating film 122 can be formed by etching back an oxide film covering the dummy electrodes.

Then, n-type conductive impurities are implanted into the first region 113n and p-type conductive impurities are implanted into the second region 113p by masking with the gate electrodes 121 and 132 and the gate electrode sidewall insulating films 122 and 133, so that deep junction regions 119b and 130b are formed. Subsequently, implanted impurities are activated by heat treatment so as to form source/drain regions 119 and 130.

Then, a Ni film (not shown) is formed to cover the surface of the Si substrate 111 except the surfaces of the first gate laminated body 123 and the second gate laminated body 134, and $NiSi_2$ silicide films 124 and 135 are formed in the source/drain regions 119 and 130 by heat treatment at 450° C. Then, unreacted areas of the Ni film are removed. The Ni film covering the Si substrate 111 is not diffused into the W gate electrodes during the heat treatment even if the Ni film is deposited on the gate electrodes. Therefore, the Ni film deposited on the gate electrodes can be easily removed together with the unreacted areas of the Ni film.

Figure 3B:
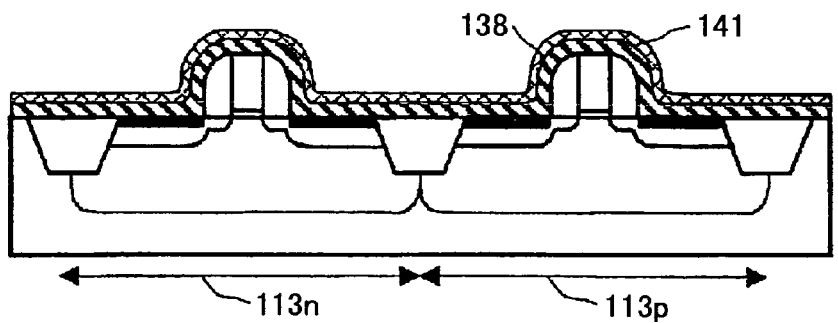

Then, referring to FIG. 3B, an 80 nm thick first silicon nitride film 138 having a compressive stress is formed on the entire surface of the structure of FIG. 3A. The first silicon nitride film 138 is formed by a chemical reaction under a condition where the substrate temperature is 400° C. through 700° C., the pressure is 13.3 Pa (0.1 Torr) through 53.3 KPa (400 Torr), and the RF power is 100 W through 1000 W, while supplying an $SiH_4$ gas (flow rate: 100 through 1000 sccm), an $NH_3$ gas (flow rate: 500 through 10,000 sccm), and $N_2$ and Ar gases (flow rate: 500 through 10,000 sccm for each). The first silicon nitride film 138 formed under this condition has a compressive intrinsic stress of 1.4 GPa. The intrinsic stress is measured by the following method. A silicon nitride film having a thickness of 100 nm is formed on the surface of the Si substrate having a diameter of 200 mm and a thickness of 0.6 mm by the above described film forming method. Then, the curvature (curvature radius) of the Si substrate is measured by a measurement method utilizing Newton's rings. The intrinsic stress is calculated based on a relation of the modulus of elasticity of the Si substrate, the thickness of the Si substrate, the Poisson's ratio of the Si substrate, the radius of curvature of the Si substrate, and the thickness of the silicon nitride film. The silicon nitride film may have a practical thickness according to a work function of the applied gate electrode material.

Then, a silicon oxide film 141 serving as an etching stopper film is formed by a plasma CVD method. More specifically, the silicon oxide film 141 is formed by a chemical reaction with a $SiH_4+O_2$ gas at a substrate temperature of 400° C.

Figure 3C:
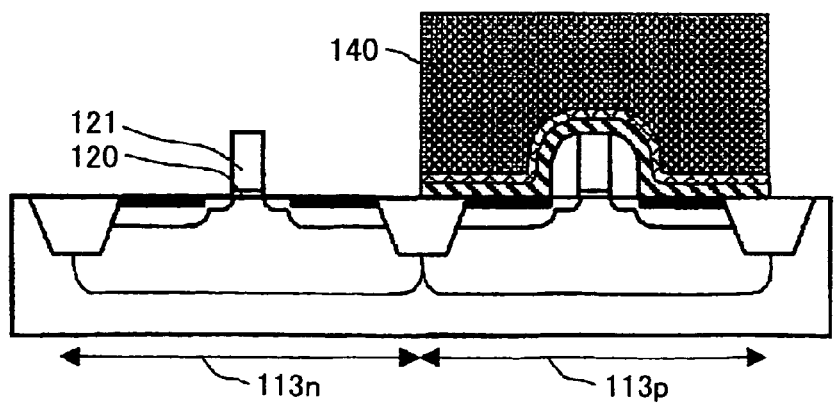

Then, referring to FIG. 3C, a resist film 140 is applied on the first silicon nitride film 138, and an opening is formed on the first region 113n. Subsequently, the silicon nitride film 138 is exposed by an RIE method. A gas containing $C_4F_8$, Ar, and $O_2$ is used in this RIE method. The surface of the Si substrate 111, and the sidewalls of the gate electrodes 121 and the sidewalls of the gate oxide film 120 are exposed by an RIE method. The gate electrode 121 shown in FIG. 3C is in a state where the gate electrode sidewall insulating film 122 is removed from the first gate laminated body 123. Gas containing $CHF_3$, Ar, and $O_2$ is used in this RIE method. After that, the resist film 140 is removed.

Figure 3D:
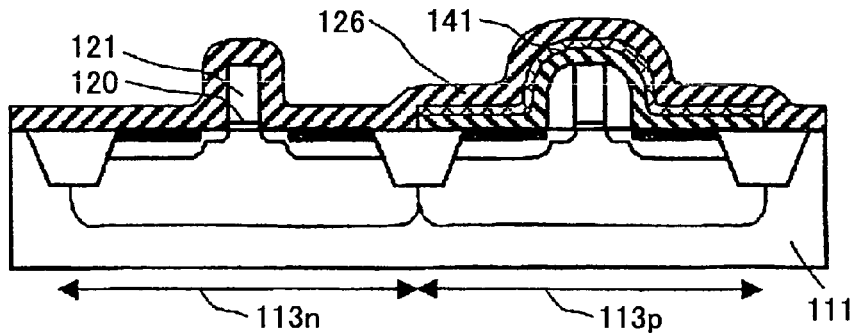

Then, referring to FIG. 3D, a 60 nm thick second silicon nitride film 126 having a tensile stress is formed by a thermal CVD method to cover the surface of the semiconductor substrate 111 in the first region 113n, the sidewalls of the gate electrodes 121, the sidewalls of gate oxide film 120, and the silicon oxide film 141 on the second region 113p. The second silicon nitride film 126 is formed by a chemical reaction under a condition where the substrate temperature is 500° C. through 700° C., the pressure is 13.3 Pa (0.1 Torr) through 53.3 KPa (400 Torr), while supplying at least one of $SiH_2HCl_2$, $SiH_4$, $Si_2H_4$, and $Si_2H_6$ gases (flow rate: 5 through 50 sccm), an $NH_3$ gas (flow rate: 500 through 10,000 sccm), and $N_2$ and Ar gases (flow rate: 500 through 10,000 sccm for each). The second silicon nitride film 126 formed under this condition has a tensile intrinsic stress of 1.4 GPa.

Figure 3E:
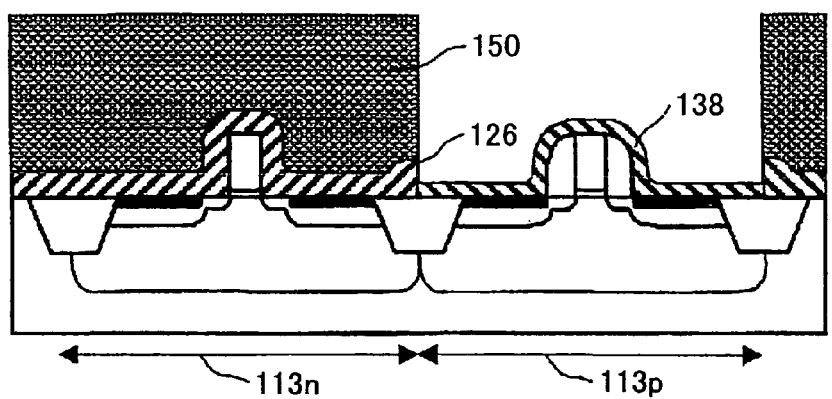

Then, referring to FIG. 3E, a resist film 150 is applied on the second silicon nitride film 126, and an opening is formed on the second region 113p by an RIE method. A gas containing $CHF_3$, Ar, and $O_2$ is used in this RIE method. Subsequently, the silicon oxide film 141 of the second region 113p is removed by an RIE method to expose the first silicon nitride film 138. A gas containing $C_4F_8$, Ar, and $O_2$ is used in this RIE method. After that, the resist film 150 is removed.

Figure 3F:
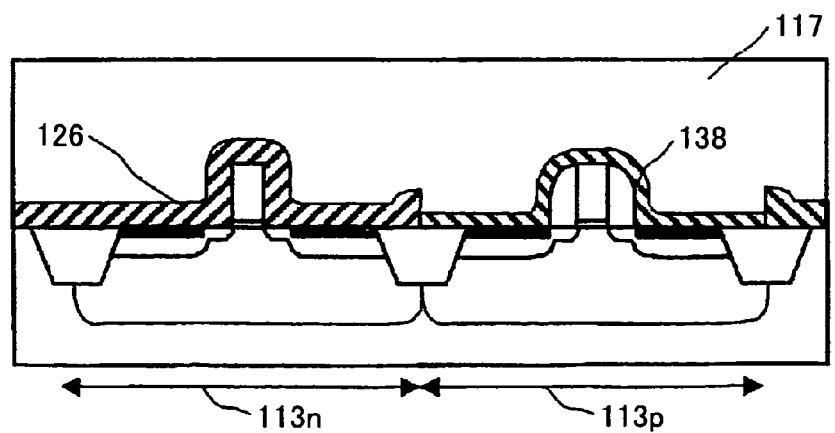

Then, referring to FIG. 3F, a 600 nm interlayer insulating film 117 made of a silicon oxide film is formed, and the surface of the interlayer insulating film 117 is flattened by a Chemical Mechanical Polishing (CMP) method.

The following describes a manufacturing flow of contact plugs of the CMOS transistor of FIG. 1 with reference to FIGS. 4A-4D.

Figure 4A:
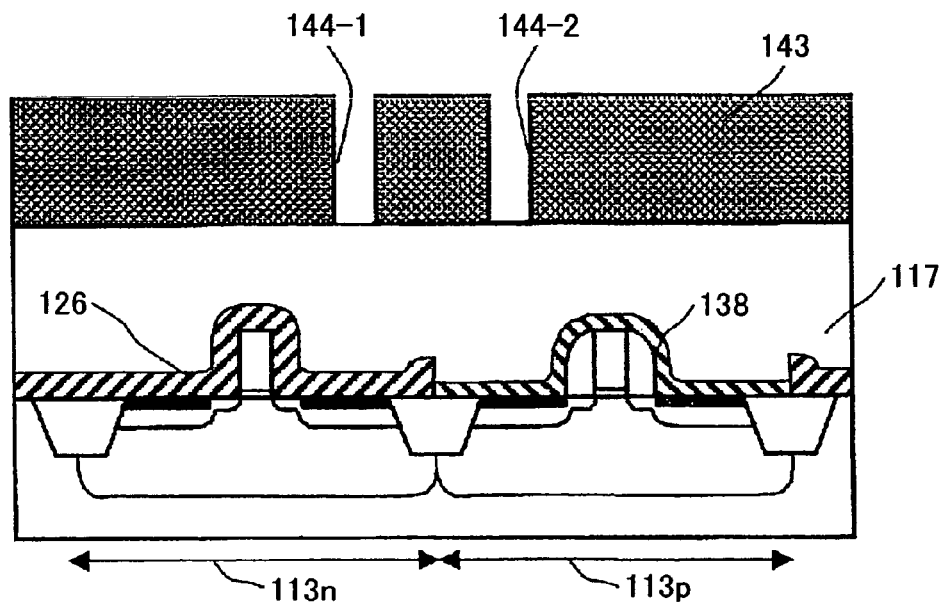
FIGS. 4A-4D are cross-sectional views illustrating a manufacturing flow of contact plugs of the CMOS transistors according to the second embodiment of the present invention.

First, referring to FIG. 4A, a resist film 143 is formed on the surface of the interlayer insulating film 117, and openings 144-1, 144-2 are formed on the first regions 113n and the second regions 113p, respectively.

Figure 4B:
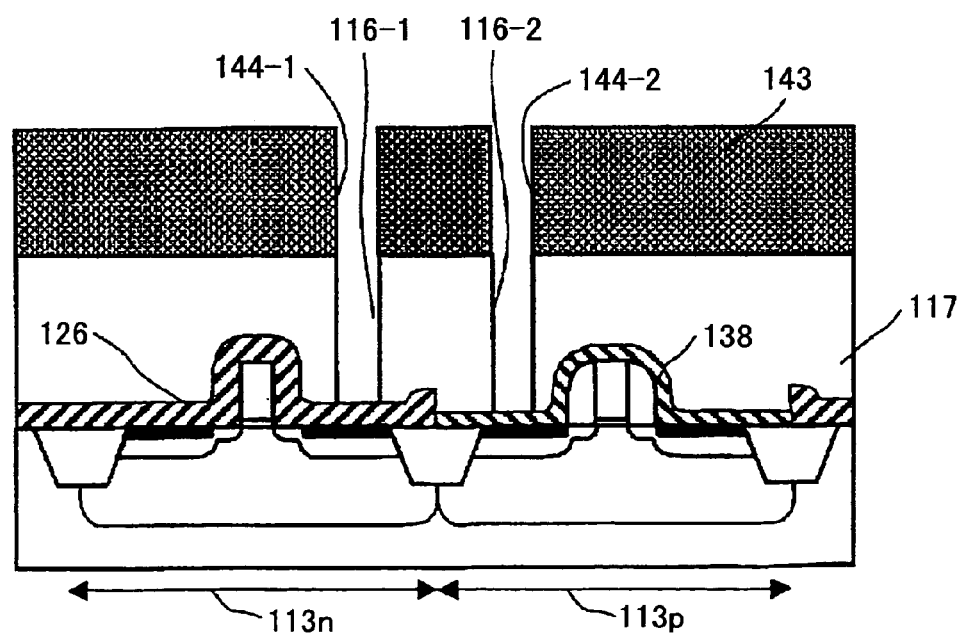

Then, referring to FIG. 4B, contact holes 116-1 and 116-2 reaching the second silicon nitride film 126 of the first region 113n and the silicon oxide film 138 of the second region 113p, respectively, are formed by an RIE method.

Figure 4C:
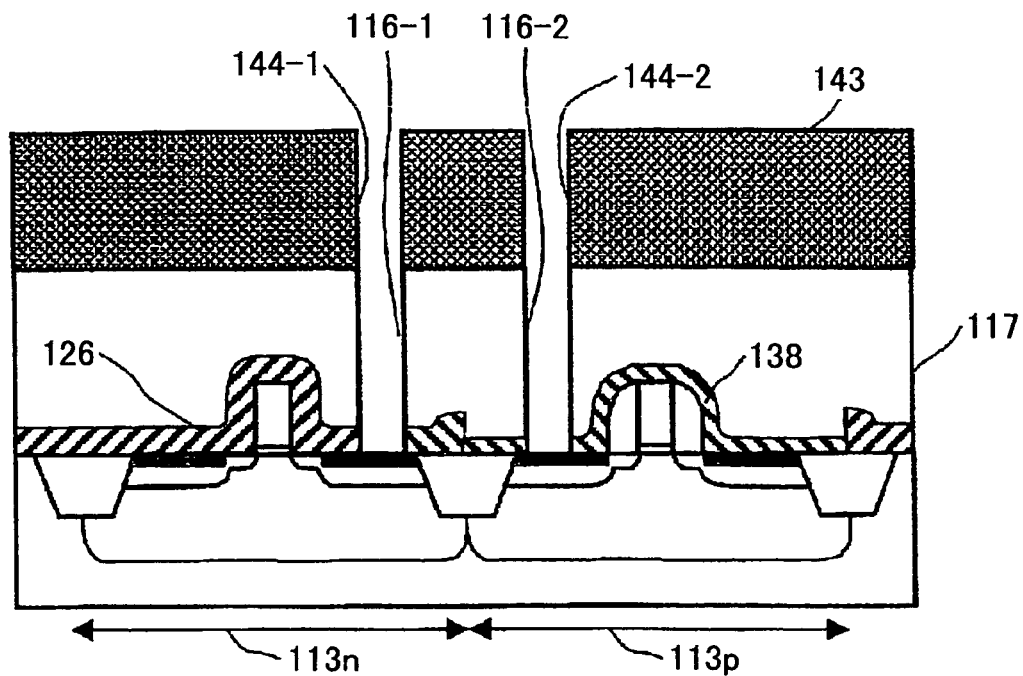

Then, referring to FIG. 4C, the contact holes 116-1 and 116-2 reaching the silicide films 124 and 135, respectively, are completed by an RIE method. Since the etching rate of the second silicon nitride film 126 and the etching rate of the first silicon nitride film 138 are different, it is preferable to choose a gas that can minimize damage to the silicide films 124 and 135. A $CHF_3$ gas is used in this RIE method. A gas containing $CF_4$ and $H_2$ is used in this RIE method.

Figure 4D:
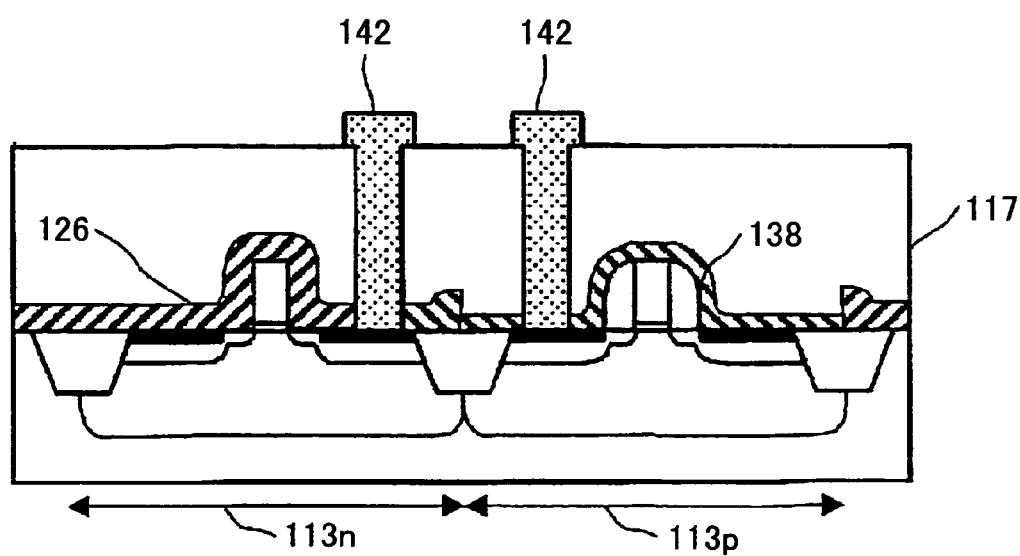

Finally, after removing the resist film 143, each of the contact holes 116-1 and 116-2 is filled with a barrier metal film (not shown) formed of a lamination layer of a Ti film/TiN film and a conductive material such as Cu (copper), W (tungsten), and Al (aluminum), so that contact plugs 142 shown in FIG. 4D are formed.

In this way, the basic structure of the CMOS semiconductor device is completed.

In the thus manufactured n-channel transistor, the gate electrode sidewall insulating film 122 is removed from the first gate laminated body 123 of FIG. 3A, and the second silicon nitride film 126 having tensile stress is formed on the surface of the semiconductor substrate 111 and the surface of the first gate laminated body 123 with the gate electrode sidewall insulating film 122 removed. Therefore, the threshold voltage of the n-channel transistor can be lowered.

Al may be applied as the metal used for the gate electrodes. In this case, the dummy gate electrodes can be replaced by the gate electrodes after the heat treatment in the impurity diffusion process.

[First Modification]

The following describes a semiconductor device according to a first modification of the second embodiment.

Figure 5:
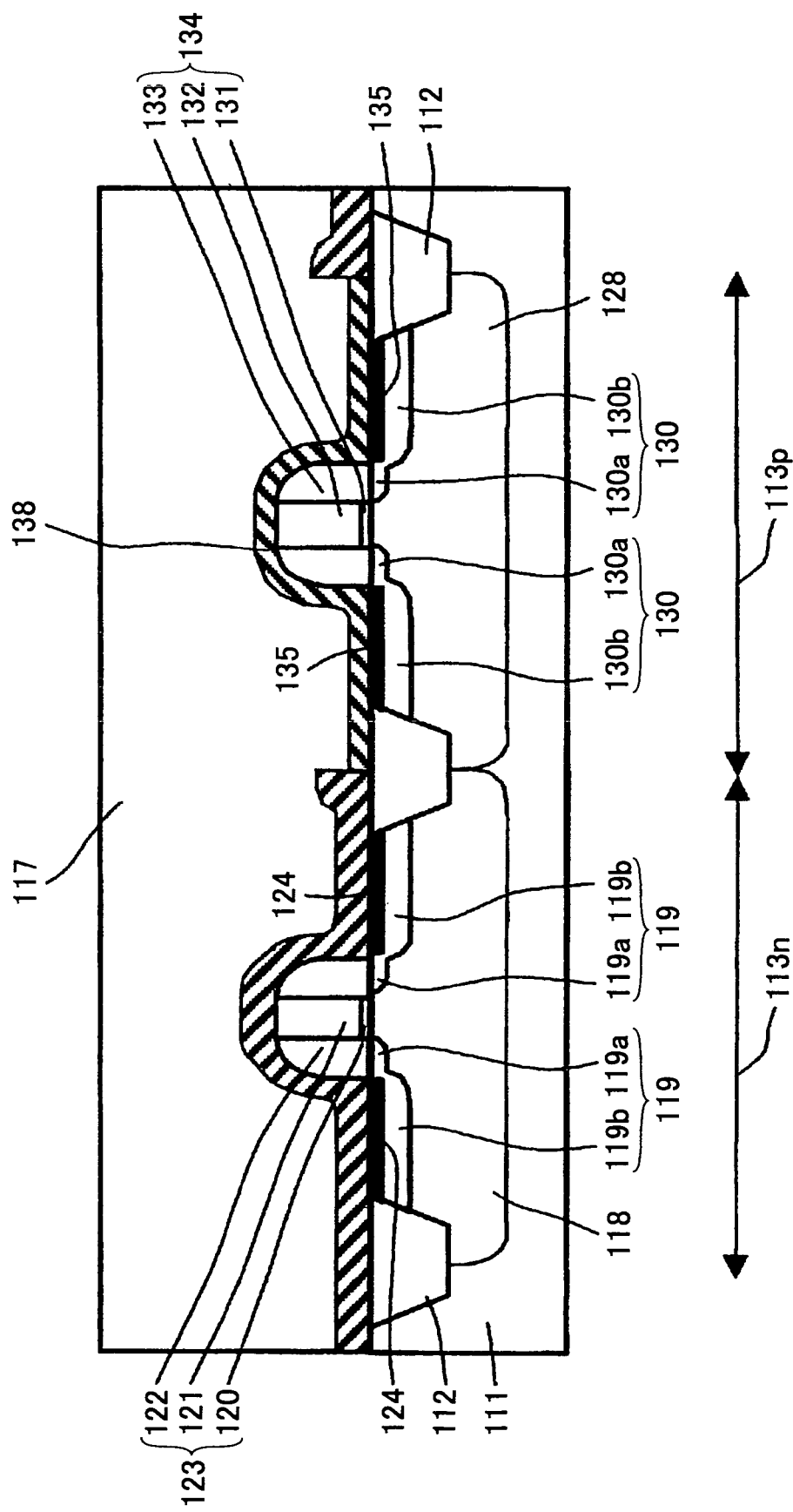
FIG. 5 is a cross-sectional view illustrating a basic structure of CMOS transistors according to a first modification of the present invention.

FIG. 5 illustrates a basic structure of a CMOS semiconductor device according to the first modification of the second embodiment. In FIG. 5, elements which correspond to elements in the above embodiments are identified by the same reference numbers and are not further described.

In the semiconductor device according to the modification of the second embodiment, the n-channel transistor has the gate electrode sidewall insulating film 122. Other elements have the same configuration as the semiconductor device of the second embodiment shown in FIGS. 3A-3D and FIGS. 4A-4D. A manufacturing method for the semiconductor device according to the modification of the second embodiment does not include the process illustrated in FIG. 3C of removing the first silicon nitride film 138 and the gate electrode sidewall insulating film 122 covering the surface of the Si substrate 111 in the first region 113n and the first gate laminated body 123. The threshold voltage may be controlled according to the work function of the metal gate even in this case. This method is preferable because fewer processes are included. Although the gate electrode sidewall insulating film 122 of the n-channel transistor is removed in the second embodiment, the gate electrode sidewall insulating film 133 may be removed if it is desired to largely change the threshold voltage of the p-channel transistor.

[Second Modification]

The following describes a second modification of the second embodiment with reference to FIG. 6.

FIG. 6 illustrates a basic structure of a CMOS semiconductor device according to the second modification of the second embodiment. In FIG. 6, elements which correspond to elements in the above embodiments are identified by the same reference numbers and are not further described.

A semiconductor device according the second modification has gate electrodes 121 and 132 made of Pt.

A manufacturing method for the semiconductor device according to the second modification of the second embodiment includes a process of selectively growing Pt in the grooves after removing the dummy electrodes described in FIG. 3A. The surface of Pt may be exposed by a CMP method as in the second embodiment. The interface between Pt and the gate insulating films 120/131 has a buffer film in order to prevent diffusion of Pt. A silicon nitride film may be applied as the buffer film. Because Pt has a work function that is close to the work function of p-doped polysilicon, the first silicon nitride film 138 for threshold voltage adjustment is not required to be provided in the second region 113p where the p-channel transistor is formed.

As described above, if a metal gate material that eliminates the need for adjusting threshold voltage of either one of the channel transistors is selected as a gate electrode material, a silicon nitride film for threshold voltage adjustment is applied to a region having the other channel transistor. Thus, a CMOS semiconductor device having desired characteristics can be obtained. To eliminate the need for adjusting threshold voltage of the n-channel transistor, Ta may be used as a gate electrode material.

Although a silicon nitride film for threshold voltage adjustment having a desired stress, which is formed under an appropriate condition using an appropriate gas, is preferable, other oxide films or ceramics materials may be alternatively used as a stress control film.

What is claimed is:

1. A semiconductor device, comprising:
    a semiconductor substrate;
    a first gate electrode formed on a first active region of the semiconductor substrate with a first gate oxide film placed therebetween;
    a first diffusion layer formed generally at a position of the first gate electrode;
    a first gate electrode sidewall insulating film covering a sidewall of the first gate electrode;
    a first silicon nitride film directly covering the first active region, the first gate electrode, and the first gate electrode sidewall insulating film;
    a second gate electrode formed on a second active region of the semiconductor substrate through a second gate oxide film;
    a second diffusion layer formed generally at a position of the second gate electrode; and
    a second silicon nitride film directly formed on the second active region and a sidewall of the second gate electrode, and having a stress different from a stress of the first silicon nitride film;
    wherein the first gate electrode and the second gate electrode are formed of metal gate electrodes at the same time.

2. The semiconductor device as claimed in claim 1, wherein the second silicon nitride film has a tensile stress and an n-channel transistor is formed in the second active region.

3. The semiconductor device as claimed in claim 1, wherein the first silicon nitride film has a compressive stress and a p-channel transistor is formed in the first active region.

4. The semiconductor device as claimed in claim 1, wherein the first metal gate electrode and the second metal gate electrode include at least one of W, Pt, Ta, and Al.

5. The semiconductor device as claimed in claim 1, wherein the second gate electrode is made of the same material as the first gate electrode.

6. The semiconductor device as claimed in claim 1, wherein the first silicon nitride film has a tensile stress and an n-channel transistor is formed in the first active region.

7. The semiconductor device as claimed in claim 1, wherein the second silicon nitride film has a compressive stress and a p-channel transistor is formed in the second active region.

* * * * *